United States Patent
Ravas et al.

[11] Patent Number: 5,666,065
[45] Date of Patent: Sep. 9, 1997

[54] FAST ACTING FET TEST CIRCUIT FOR SIR DIAGNOSTICS

[75] Inventors: Richard Joseph Ravas, Kokomo; Terrell Anderson, Carmel; Robert Keith Constable, Kokomo, all of Ind.

[73] Assignee: Delco Electronics Corp., Kokomo, Ind.

[21] Appl. No.: 651,073

[22] Filed: May 22, 1996

[51] Int. Cl.$^6$ .................... G01R 31/28; B60Q 1/00; G01M 19/00
[52] U.S. Cl. .................... 324/769; 324/505; 340/438
[58] Field of Search .................... 324/769, 502, 324/505; 340/61, 436, 438; 280/735; 307/10.1

[56] References Cited

U.S. PATENT DOCUMENTS

| | | | |
|---|---|---|---|
| 5,081,442 | 1/1992 | Ito et al. | 340/438 |
| 5,166,880 | 11/1992 | Furvi | 364/424.05 |
| 5,268,643 | 12/1993 | Aso et al. | 324/502 |

*Primary Examiner*—Kenneth A. Wieder
*Assistant Examiner*—Barry C. Bowser
*Attorney, Agent, or Firm*—Mark A. Navarre

[57] ABSTRACT

The firing circuit of an inflatable restraint system is tested to verify operation of two FETs in series with a squib which are used to apply current to the squib. For the test the squib is biased to an intermediate voltage and each FET is turned on alone to apply battery or ground voltage to the squib. High and low voltage detectors sense the voltage excursion past respective thresholds to verify FET operation, and a logic circuit immediately turns off the FET to result in a very short FET on time. If a short is present before the FET is commanded on, a detector and the logic circuit prevents FET conduction to avoid firing or degrading the squib.

7 Claims, 3 Drawing Sheets

FAST ACTING FET TEST CIRCUIT FOR SIR DIAGNOSTICS

FIELD OF THE INVENTION

This invention relates to supplemental inflatable restraint (SIR) systems for automotive vehicles and particularly to a method and an apparatus for rapid testing FETs in a SIR firing circuit and detecting shorts of a firing circuit to ground or to its supply voltage.

BACKGROUND OF THE INVENTION

Supplemental inflatable restraint (SIR) systems for automotive vehicles generally employ a firing circuit having a squib for causing inflation of an air bag, and a deployment circuit having an accelerometer sensitive to vehicle motion, especially deceleration, and a microprocessor monitoring the accelerometer output for evaluating the severity of a crash to determine whether to deploy the air bag. The vehicle battery or ignition system voltage empowers the deployment circuit and the firing circuit. The deployment circuit and the firing circuit are to a large extent embodied with a microprocessor on an integrated circuit chip, but an external harness leads to a squib at the site of each air bag.

It is conceivable that some portion of the harness might become damaged and short to ground or even to the vehicle battery voltage. To forestall the possibility that such inadvertent electrical connection to the firing circuit might cause deployment of the air bag or disable the system, it is desirable to monitor the system to detect any such event. It is already known to diagnose a short of the firing circuit by feeding a small test current through the squib and through a biasing resistor to ground. The resulting bias voltage will depend on the current and if there are no shorts to the firing circuit the resulting test voltage will be at a prescribed value. To assure this, the test current is carefully controlled. Where, for example, the current is provided by a current source on an integrated circuit, the circuit must be trimmed during manufacture to assure the correct current output. The test voltage is sampled by an A/D converter and fed to the microprocessor where it is monitored to detect a low value indicative of shorting to ground or a high value indicative of shorting to supply voltage.

The firing circuit includes a pair of FETs, one on each side of the squib. To deploy the air bag, the squib is fired by turning on both FETs. Thus to assure readiness to fire it is desirable to occasionally test the FETs (and their drive circuits) for operability. In prior systems the FETs were tested by commanding on a single FET at a time, and monitoring for the voltage on the deployment loop to go high (for a high side FET test) or low (for a low side FET test). This was accomplished by monitoring the low or high side of the deployment loop with an amplifier and then disabling the FET after a brief duration (several hundreds of microseconds). A microprocessor would be responsible for monitoring the low side of the squib, first checking to see that the squib was not shorted to battery or ground, and then commanding on the FET to be diagnosed. After a few hundred microseconds of delay, the amplifier would be checked, and the FET then disabled. With that arrangement it is conceivable that a short to ground (or battery) could occur immediately before or during testing the high side (or low side) FET. This has the possibility of causing an inadvertent deployment or degradation of the squib.

SUMMARY OF THE INVENTION

It is therefore an object of the invention to rapidly test FETs of a SIR firing circuit while minimizing any likelihood of a short occurring during such test. Another object is to test for shorts to battery or ground with the same circuit used for the FET tests.

A SIR firing circuit has a squib serially connected through high and low side FETs between a power supply and ground. A bias voltage is applied to the squib and variations from that voltage are detected by high and low voltage detectors having thresholds set above and below the bias voltage. A detector is triggered if the squib is shorted to battery voltage or to ground, or if either FET conducts to apply high or ground voltage to the squib. The short causes an output signal even before a FET test signal is given.

A test signal for either FET is applied to a FET test logic circuit to command turning on a selected one of the FETs. If a detector is already triggered due to a short, the command is not delivered to the FET gate driver. If there is no short, the selected FET is turned on, causing the squib voltage to quickly change and trigger a detector, and the logic circuit then turns off the FET so that it is on for only a brief period. The affected detector then turns off but the on signal is latched to hold the FET off and to produce an output which is indicative of acceptable FET operability. Then the test signal for the other FET is issued. The detector outputs are monitored to determine that each FET operates when commanded, thereby verifying the operability of the FETs and their driving circuits, or diagnosing a fault.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
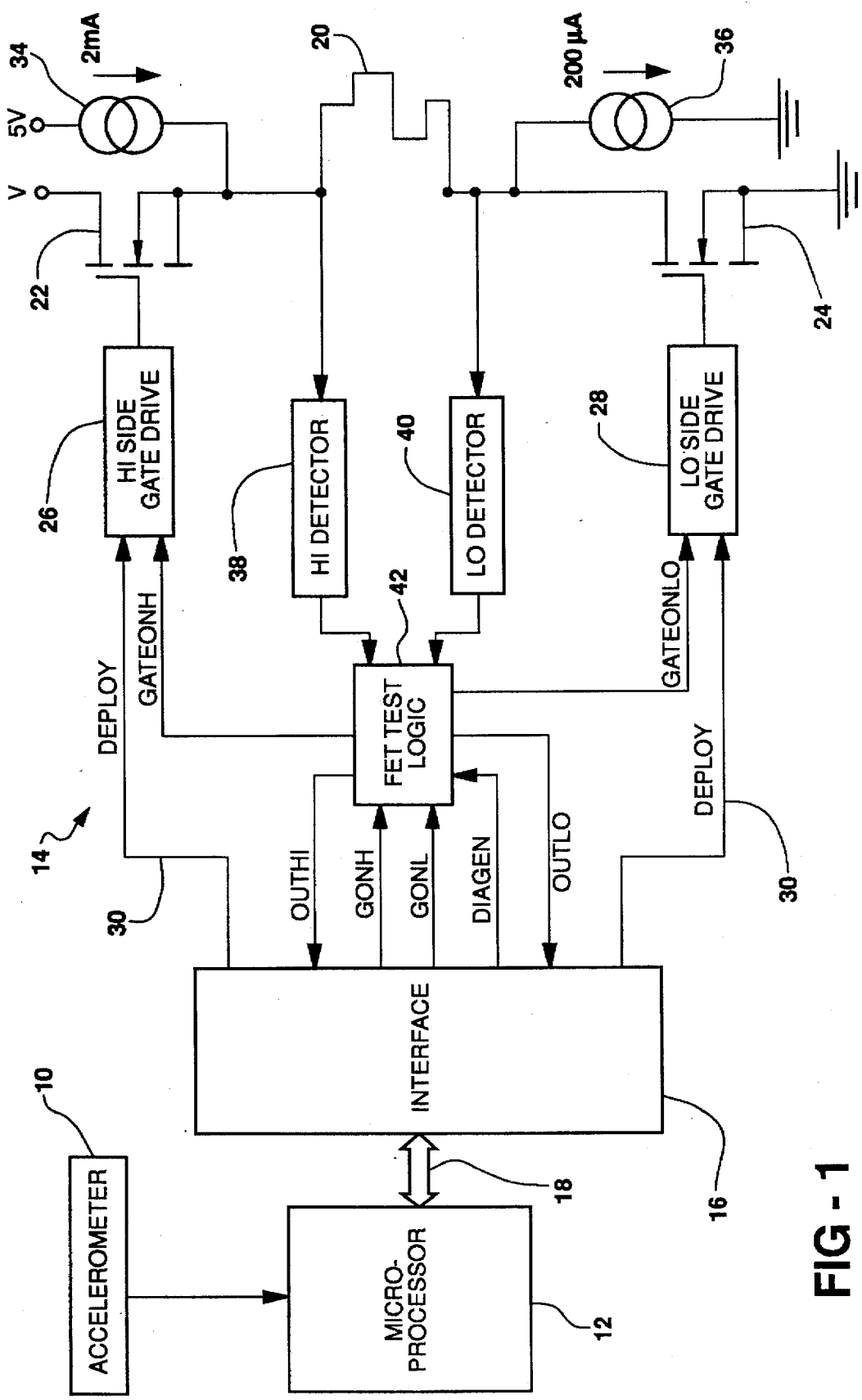
FIG. 1 is a block diagram of a SIR system including a FET test circuit according to the invention.

Referring to FIG. 1, a supplemental inflatable restraint (SIR) control for inflating an air bag (not shown) includes an accelerometer 10 which senses vehicle acceleration coupled to a microprocessor 12 which interprets acceleration data and decides when to deploy the air bags. This portion of the system is considered to be the deployment circuit. The firing circuit is incorporated in an application specific integrated circuit (ASIC) 14 having a serial interface 16 coupled by a data bus 18 to the microprocessor 12. An external squib 20 is connected by a wiring harness to the ASIC output. A high side FET 22 is serially connected between battery or ignition voltage V and one side of the squib and a low side FET 24 is serially connected between the other side of the squib and ground. The FETs 22 and 24 are driven by a high side gate drive 26 and a low side gate drive 28, respectively. The gate drives are connected by lines 30 to the interface to carry deploy signals when issued by the microprocessor 12. Thus when the microprocessor issues a deploy command the interface will apply firing signals to the gate drives 26 and 28 via lines 30 to turn on the FETs 22 and 24 to fire the squib 20.

To assure that the FETs and the gate drives are operable and that there is no shorting to battery or ground of the harness connected to the squib, a test circuit monitors the circuit condition. Each time the vehicle ignition is turned on, the squib voltage is monitored to detect a short, and the microprocessor issues test signals which cause the FETs to be turned on, one at a time, and the effect on the squib voltage is recorded.

A 2 ma current source 34 supplied by 5 volts is connected to the high side of the squib 20 and a 200μ a current sink 36 to ground is connected to the low side of the squib to establish a nominal 5 volts bias on the squib. A high voltage detector 38 and a low voltage detector 40 are connected to the high and low sides of the squib, respectively. The detector outputs are connected to the interface and are relayed to the microprocessor. A FET test logic circuit 42 receives the detector outputs as well as a diagnostic enable (DIAGEN) signal, a high side gate turn-on command (GONH) and a low side gate turn-on (GONL) supplied by the microprocessor 12 through the interface 16. The test logic circuit has outputs to the two gate drivers 26 and 28 to turn on the FETs for testing.

Figure 2:
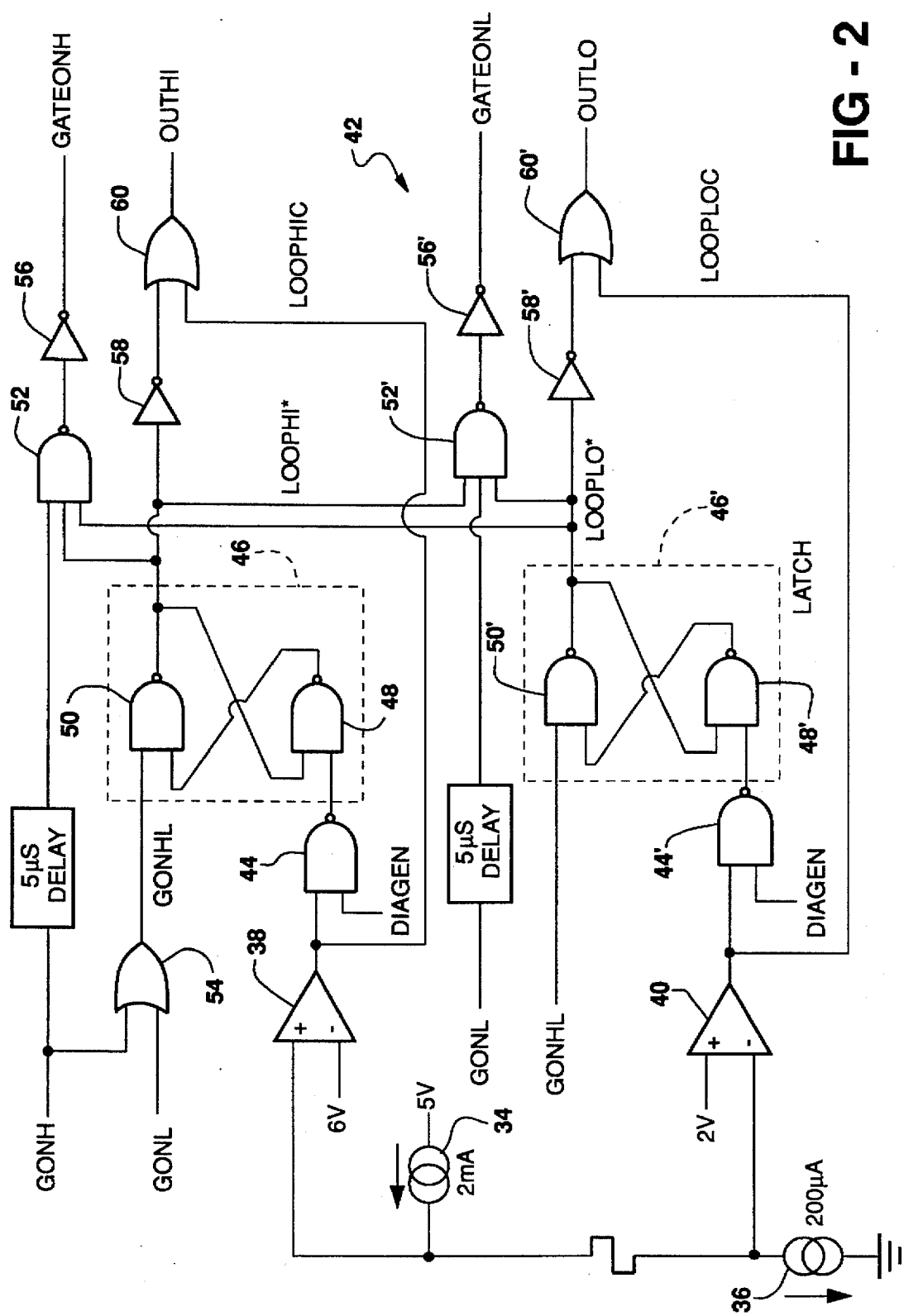
FIG. 2 is a schematic diagram of the test circuit of FIG. 1.

FIG. 2 shows the test logic circuit 42 and the detectors 38 and 40, as well as the squib 20 and the current source 34 and sink 36. The high voltage detector 38 is a comparator referenced to a 6 volt threshold to produce a positive output (LOOPHIC) when the squib voltage exceeds 6 volts. The low voltage detector 40 is a comparator referenced to a 2 volt threshold to produce a positive output (LOOPLOC) when the squib voltage drops below 2 volts.

The test logic circuit 42 has two identical sections, one for the high side and the other for the low side. The high side will be described and the corresponding low side elements are denoted by primed numerals in the drawing. The high side logic has a NAND gate 44 having as inputs the detector 38 output LOOPHIC and the diagnostic enable input DIAGEN. A latch 46 comprises NAND gate 48 and NAND gate 50 each having an output coupled to the input of the other, and NAND gate 48 has an input from the gate 44. The commands GONH and GONL from the interface are combined in an OR gate 54 to produce GONHL which is coupled to NAND gate 50 to enable the latch 46. When the latch 46 is enabled by the OR gate 54, the latch output LOOPHI* is the logical inverse of the signal LOOPHIC, at least initially, and supplies one of three inputs to NAND gate 52. The other two inputs are LOOPLO* from the low side of the test logic and the test command GONE which is delayed for 5 μ sec. The output of NAND gate 52 is fed through an inverter 56 to produce the signal GATEONH to activate the high side gate drive 26 and turn on FET 22. The output LOOPHI* of the latch 46 is fed through an inverter 58 to an OR gate 60 where it is combined with LOOPHIC to produce an output OUTHI which is coupled to the microprocessor via the interface. In the same way the low side logic circuit produces an output OUTLO.

In operation, the microprocessor samples the outputs OUTHI and OUTLO to determine the presence of shorts. If there is a short to battery or ignition voltage, the detector 38 will have a high output LOOPHIC which results in OUTHi being high. Similarly, a short to ground causes detector 40 to have a high output LOOPLOC and the signal OUTLO will be high. Thus if either output is high a short is present and a fault is indicated. In that case a FET test is largely irrelevant and the microprocessor will not initiate the FET test. If it is determined that there is no short, as is the usual case, the microprocessor issues the command DIAGEN to enable FET diagnostics and the command GONH to turn on the high side FET. That test is quickly completed and then DIAGEN and GONL are issued to test the low side FET.

For the high side test, for example, the command DIAGEN enables the input to the NAND gate 48 and the command GONH enables the NAND gate 50 so that the latch 46 is operative. (Note that the latch 46' is also rendered operative). The GONH command attempts to turn activate the NAND gate 52 after a short delay to assure that the latch will first operate. If a short to battery is present, the detector 38 will have a high output and the latch 46 output LOOPHI* will be low, preventing operation of the NAND gate 52. The same is true if there is a short to battery; the latch 46' output LOOPLO* will be low. The output OUTHI will be high but the microprocessor will not interpret that as a successful FET test because of the previous finding of a short. The chief feature of the circuit, however, is that the FET will not be turned on when a short to either battery or ground is present, thereby avoiding deployment or squib degradation. However, if there is no short, both latch outputs will be high causing GATEONH to go high to turn on the high side FET 22. The FET operation applies high voltage to the squib which causes the detector 38 to go high and the latch 46 output to go low, to immediately turn off the FET. Thus the FET will be on for only a few microseconds instead of hundreds of microseconds as in previous tests. The latch will hold the low output until the GONH command is removed. The low side logic works in the same manner, but relies on the latch 60 to turn off the low side FET just after it is turned on. In the absence of a prior short indication, the high values of OUTHI and OUTLO are then interpreted by the microprocessor as verification of the FET operation. However, if a short occurs during the FET test, it is extremely unlikely that it would first occur in the very short period of FET conduction. Even if a short did occur during this short period, deployment or squib degradation will not occur for such a brief current flow.

Figure 3:
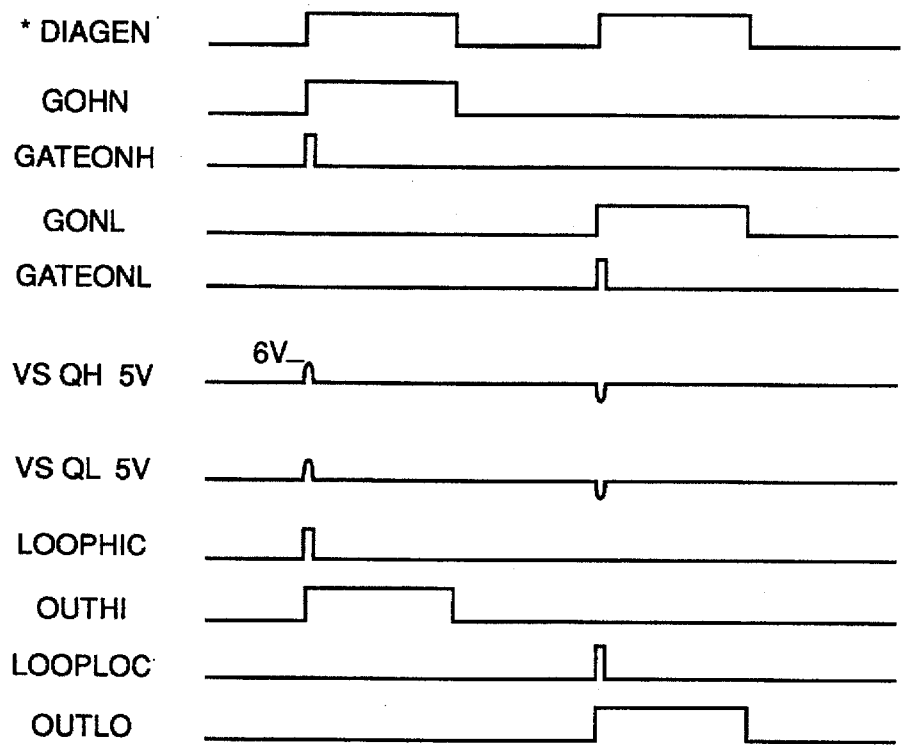
FIG. 3 is a set of waveforms illustrating the operation of the test circuit for a normal firing circuit.

FIG. 3 illustrates the circuit operation by showing the states of the various signals. In FIG. 3 (and FIG. 4) the signal levels are either 0 or 5 v, except for VSQH and VSQL where the base line is at 5 v. When vehicle ignition is turned on the microprocessor 12 first tests for shorts by sampling the states of OUTHI and OUTLO. Then, as shown in FIG. 3, if there are no shorts, the signal DIAGEN goes high for two test periods. GONH is commanded to be high during one DIAGEN period and GONL is high in the other period. When GONH is asserted GATEONH goes high to turn on the high side FET and the high side squib voltage VSQH rises above 6 volts to trigger the detector 38, turning on LOOPHIC. Due to the latch action LOOPHI* goes low to turn off the FET, and GATEONH, VSQH and LOOPHIC go low only a few microseconds after going high. The output OUTHI is turned on by the initial LOOPHIC signal and is held on by LOOPHI* for the duration of GONL. Similar action occurs during the period when GONL is high. Then GATEONL is on high only briefly and the low side voltage goes low to trigger the detector 40. Thus the low side FET will be turned on for only a few microseconds and the output OUTLO will be high for the duration of GONL.

Figure 4:
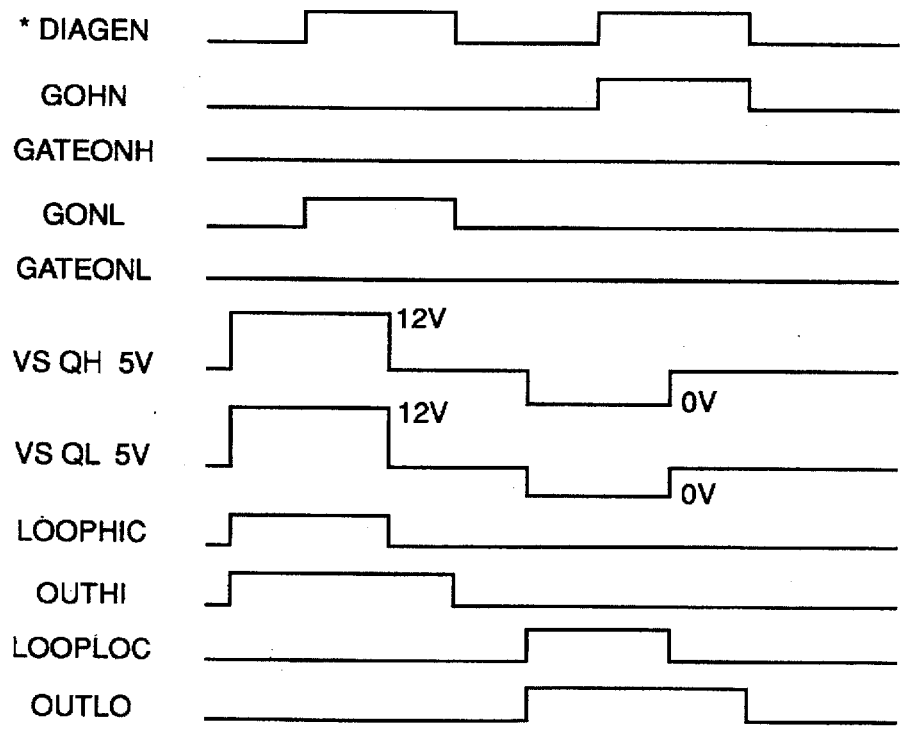
FIG. 4 is a set of waveforms illustrating the operation of the test circuit for a firing circuit having shorts to ground or battery.

FIG. 4 shows the effects of a short to ground or to battery when the test signals are applied. This would occur only if a short occurs after the microprocessor tests OUTHI and OUTLO for shorts. VSQH shows a 12 volt level for a first period resulting from a short to battery. This is detected by detector 38 and LOOPHIC goes high for the entire period. This forces the latch 46 output low to hold the FET off when DAIGEN and GONH go high. Since the latch output LOOPHI* is input to both gates 52 and 52', both FETs will be held off due to the short. In the same way, VSQL shows a short to ground for a second period causing LOOPLOC to go high and the latch 46' and gates 52 and 52' will hold the FETs off. Thus when a short occurs before the FET test, the FET is not enabled. Even if a short were initiated when the FET is on or just coming on, the few microseconds of FET conduction is not sufficient to cause deployment. It will be understood that in practice the shorts will not occur in discrete periods but are likely to extend throughout the test period.

The embodiments of the invention in which an exclusive property or privilege is claimed are defined as follows:

1. In an automotive supplemental inflatable restraint system having a firing circuit containing a squib between two FETs serially coupled between a voltage source and ground for effecting inflation of a restraint, and a deployment circuit for controlling the firing circuit, a test circuit for FETs comprising:

a regulated voltage source applied to the squib;

detector means coupled to the firing circuit for detecting variance of the voltage on the squib beyond set thresholds above and below the regulated voltage;

gate means responsive to a test signal for turning on a selected FET whereby the voltage on the squib varies beyond one of the thresholds while the selected FET is on;

the gate means including a logic circuit responsive to the detector means for preventing conductance of the selected FET when the voltage breaches a threshold so that the selected FET, if turned on, is held on for only a short period, and the logic circuit including means for producing an output signal indicative of FET operability.

2. The invention as defined in claim 1 wherein the squib is subject to shorting to ground or vehicle battery voltages and wherein:

the thresholds are set to detect voltages due to shorting to either ground or battery; and the logic circuit prevents conductance of a selected FET when shorting to either ground or battery is detected.

3. The invention as defined in claim 1 wherein the logic circuit includes:

a control gate coupled to each FET to turn on a selected FET; and latch means responsive to the detector means for disabling both control gates when either threshold is breached whereby the FETs are held off in the event of a short condition.

4. The invention as defined in claim 1 wherein the gate means includes:

a gate responsive to a diagnostic enabling signal for enabling the gate means only during the diagnostic enabling signal.

5. A method of testing FETs in a SIR firing circuit having a pair of FETs in series with a squib and powered by a vehicle battery, the method comprising the steps of:

establishing upper and lower voltage thresholds;

applying a regulated voltage to the squib, the voltage normally lying between the thresholds and being subject to variance beyond either threshold in the event of a short to ground or vehicle battery voltage or upon FET conduction;

applying a test signal for turning on a selected FET;

turning on a selected FET in response to the test signal;

detecting voltage excursions beyond either threshold caused by FET conduction;

terminating the FET conduction upon detection of the voltage excursion thereby limiting the voltage excursion to a brief period; and verifying the operation of the selected FET by producing an output signal in response to the brief period of voltage excursion.

6. The invention as defined in claim 5 including:

preventing FET turn-on when such voltage excursions are present when the test signal is applied, whereby FET conduction does not occur during a short of the squib to ground or battery voltage.

7. The invention as defined in claim 5 including: producing a detection signal when a voltage excursion beyond a threshold is detected;

terminating the FET conduction is response to the detection signal; and latching the state of the detection signal for the duration of the test signal to hold the FET nonconductive.

* * * * *